United States Patent
Meng et al.

(10) Patent No.: US 12,032,017 B2
(45) Date of Patent: Jul. 9, 2024

(54) CHIP DETECTION DEVICE, CHIP DETECTION SYSTEM, AND CONTROL METHOD

(71) Applicant: SHANDONG CAIJU ELECTRONIC TECHNOLOGY CO., LTD, Zibo (CN)

(72) Inventors: Meng Meng, Zibo (CN); Xiangdong Li, Zibo (CN)

(73) Assignee: Shandong Caiju Electronic Technology Co., Ltd., Zibo (CN)

( * ) Notice: Subject to any disclaimer, the term of this patent is extended or adjusted under 35 U.S.C. 154(b) by 96 days.

(21) Appl. No.: 17/784,912

(22) PCT Filed: Dec. 2, 2020

(86) PCT No.: PCT/CN2020/133240
§ 371 (c)(1),
(2) Date: Jun. 13, 2022

(87) PCT Pub. No.: WO2021/115169
PCT Pub. Date: Jun. 17, 2021

(65) Prior Publication Data
US 2023/0003794 A1    Jan. 5, 2023

(30) Foreign Application Priority Data

Dec. 13, 2019 (CN) .......................... 201911284104.9
Dec. 13, 2019 (CN) .......................... 201911284507.3

(51) Int. Cl.
*G01R 31/28* (2006.01)
*B65G 47/91* (2006.01)
*G01R 1/073* (2006.01)

(52) U.S. Cl.
CPC ....... *G01R 31/2893* (2013.01); *B65G 47/912* (2013.01); *G01R 1/073* (2013.01); *G01R 31/2868* (2013.01); *G01R 31/2887* (2013.01)

(58) Field of Classification Search
CPC .... G01R 31/00; G01R 31/28; G01R 31/2851; G01R 31/2855; G01R 31/286;
(Continued)

(56) References Cited

U.S. PATENT DOCUMENTS

| 6,218,852 | B1 | 4/2001 | Smith |
| 2002/0195313 | A1 | 12/2002 | Fujimori et al. |
| 2008/0116925 | A1* | 5/2008 | Sunohara ........... G01R 31/2875 374/142 |

FOREIGN PATENT DOCUMENTS

| CN | 102698969 A | 10/2012 |
| CN | 102944707 A | 2/2013 |

(Continued)

OTHER PUBLICATIONS

English Translation of the International Search Report filed in International Application No. PCT/CN2020/133240, mailed Feb. 25, 2021, 3 pages.

(Continued)

*Primary Examiner* — Hoai-An D. Nguyen
(74) *Attorney, Agent, or Firm* — Meunier Carlin & Curfman LLC

(57) ABSTRACT

A chip detection device, a chip detection system and a control method. The chip detection device includes a support plate (100), a probe holder (110) disposed on an upper part of the support plate (100), a detection platform, and a first driving device (120) connected to the probe holder (110). The chip detection system includes a cabinet (600), which is internally provided with a chip detection device, a controller, a loading manipulator (910), an unloading manipulator (920), a chip tray bracket (700) disposed on a side of the (Continued)

loading manipulator (910), and a distribution tray (800) disposed on a side of the unloading manipulator (920). According to the chip detection device, the chip detection system and the control method, during the rotation of the turntable (200), the filling, detection and classification of the chips are all controlled to be automatically completed under the control of an automatic control program, which greatly improves the efficiency of the chip detection.

31 Claims, 7 Drawing Sheets

(58) Field of Classification Search
CPC .......... G01R 31/2865; G01R 31/2867; G01R 31/2868; G01R 31/2886; G01R 31/2887; G01R 31/2889; G01R 31/2893; G01R 1/00; G01R 1/02; G01R 1/06; G01R 1/067; G01R 1/073; B65G 47/00; B65G 47/74; B65G 47/90; B65G 47/91; B65G 47/912
USPC ............... 324/500, 537, 762.01, 762.06
See application file for complete search history.

(56) References Cited

FOREIGN PATENT DOCUMENTS

| | | | | |
|---|---|---|---|---|
| CN | 106876306 | A | 6/2017 | |
| CN | 108828372 | A | 11/2018 | |
| CN | 208969202 | U | 6/2019 | |
| CN | 110371596 | A | 10/2019 | |
| CN | 111273162 | A | 6/2020 | |
| CN | 111308325 | A | 6/2020 | |
| CN | 212275887 | U | 1/2021 | |
| CN | 212275888 | U | 1/2021 | |
| JP | 6440584 | B2 | 12/2018 | |
| KR | 101979336 | B1 | 5/2019 | |
| TW | 1420613 | B * | 12/2013 | ......... G01R 31/2887 |
| WO | WO-2008078939 | A1 * | 7/2008 | ......... G01R 31/2893 |

OTHER PUBLICATIONS

European Search Report dated Dec. 11, 2023.
KR Office Action, Application No. 10-2022-7023338, dated Mar. 14, 2024.

* cited by examiner

CHIP DETECTION DEVICE, CHIP DETECTION SYSTEM, AND CONTROL METHOD

RELATED APPLICATION CROSS-REFERENCE TO RELATED APPLICATIONS

This application is a United States National Phase Patent Application of International Patent Application Number PCT/CN2020/133240, filed on Dec. 2, 2020, which claims priority to Chinese Patent Application No. 201911284507.3, filed Dec. 13, 2019, entitled 'chip detection system and method', and Chinese Patent Application No. 201911284104.9, filed on Dec. 13, 2019, entitled 'chip detection device'.

FIELD

The present disclosure relates to a chip detection apparatus, and particularly to a chip detection device, a chip detection system and a control method.

BACKGROUND

Chip generally refers to a carrier of an integrated circuit, and it is also an integrated circuit that has been designed, manufactured, packaged and tested. The chip is usually an independent entirety that can be used immediately. An electronic chip is a miniature electronic device or component, in which a process is adopted so that wirings and elements such as transistors, resistors, capacitors and inductors required in a circuit are interconnected together, fabricated on one or several small semiconductor wafers or dielectric substrates, and packaged in a shell to form a miniature structure with required circuit functions. All the elements have been structurally integrated as a whole, which makes electronic elements take a big step towards miniaturization, low power consumption, intelligence and high reliability. After an electronic chip is produced, it is necessary for an electronic chip apparatus to conduct comprehensive tests and current and voltage tests on the electronic chip. In the prior art, a detection mode of the electronic chip is that a detection worker holds a detection probe led out from an electrical detection box, and judges whether the electronic chip is qualified by observing states of indicator lights on the electrical detection box and parameters displayed on a display screen. However, this detection mode not only involves intensive labors, but also leads to errors caused by shaking of the detection probe in the detection process, which seriously affects the detection accuracy and has poor practicability. Therefore, it is urgent to design an automatic apparatus for quickly and efficiently detecting chips.

SUMMARY

The present disclosure provides a chip detection device, a chip detection system and a control method to improve the speed and efficiency of chip detection.

The technical features of the present disclosure are given as follows.

The present disclosure provides a chip detection device, including: support plates, a detection platform erected between two of the support plates, a first driving device disposed on the support plate and capable of a linear motion, and a probe holder disposed above the detection platform and connected to the first driving device; the detection platform includes: a turntable of a cylindrical structure, with two ends rotatably connected to the support plates; a vacuum ring having one end provided with an end face fixedly connected to the support plate, and the other end provided with an end face hermetically and rotatably connected to an end face of the turntable; a second driving device disposed on the support plate and capable of driving the turntable to rotate; at least three groups of chip test trays uniformly distributed on a cylindrical surface of the turntable, each group of chip test trays being arranged in a length direction of the cylindrical surface of the turntable; the chip test tray is provided with a chip placement slot, bottoms of the chip placement slots on all of the chip test trays are electrically communicated with each other, and a center of the bottom of the chip placement slot is provided with an adsorption through hole; the turntable is provided with: a main gas hole disposed in an axial direction of the turntable and corresponding to the chip test tray in a radial direction of the turntable, an end of the main gas hole close to the vacuum ring being opened and the other end thereof being closed; and a branch gas hole which communicates the main gas hole and the adsorption through hole of the chip test tray; the vacuum ring is provided with a negative-pressure gas hole which has one orifice located on an end face of the vacuum ring abutting against the turntable and on a same circumference as the main gas hole, and the other orifice connected to a negative-pressure gas source; the orifice of the negative-pressure gas hole or an orifice of the main gas hole is provided with a communication slot which communicates the negative-pressure gas hole and the main gas hole when they are staggered.

The present disclosure further provides a chip detection system, including a cabinet, which is internally provided with a controller, a loading manipulator, an unloading manipulator, a chip tray bracket disposed on a side of the loading manipulator, and a distribution tray disposed on a side of the unloading manipulator; a chip detection device is disposed between the loading manipulator and the unloading manipulator; the chip detection device includes: support plates fixedly connected to a cabinet, a detection platform erected between two of the support plates, a probe holder disposed above the detection platform, a first driving device disposed on the support plate and capable of driving the probe holder to move longitudinally, and a second driving device disposed on the support plate and capable of driving the detection platform to rotate; the controller is electrically connected to the loading manipulator, the unloading manipulator and the chip detection device, and controls the loading manipulator to place a chip from the chip tray bracket onto the rotating detection platform; when the chip rotates with the detection platform to an upper position facing the probe holder, the probe holder descends to detect the chip, and the controller controls the unloading manipulator to remove the chip that has been detected on the detection platform and place the chip in the corresponding distribution tray.

The present disclosure further provides a control method of the chip detection system, including the steps of:

after the chip detection system is started, turning on a negative-pressure gas source of a negative-pressure gas hole and a positive-pressure gas source of a positive-pressure gas hole on a vacuum ring; a main gas hole on the rotating turntable obtains a gas supply through the vacuum ring; Step A: controlling a loading manipulator to move above a chip tray, and adjusting a vacuum sucker of the loading manipulator to face downward, so that the vacuum sucker of the loading manipulator corresponds to a column of chips on the chip tray; turning on the negative-pressure gas source of the loading manipulator and moving the loading manipulator downward until the vacuum sucker of the loading manipulator adsorbs a chip on the chip tray; or, moving the loading manipulator downward until the vacuum sucker of the loading manipulator is close to the chip, and turning on the negative-pressure gas source to adsorb the chip onto the vacuum sucker of the loading manipulator; controlling the loading manipulator to move upward, and rotating an operating arm until the vacuum sucker of the loading manipulator is opposite to a chip placement slot of a chip test tray on the turntable; controlling the loading manipulator to move to the turntable until the chip is placed in the chip placement slot, and turning off the negative-pressure gas source of the loading manipulator; repeating step A, until all chip placement slots on a left side of the turntable are filled with the chips; Step B: when a side surface of the turntable rotates to a horizontal plane at the upper part of the turntable, controlling the first driving device to drive the probe holder to descend until a probe on the probe holder abuts against the chip in the chip placement slot; starting a test program to test the chip; after the chip is tested, recording a test result, and controlling the first driving device to drive the probe holder to rise; Step C: turning on the negative-pressure gas source of the unloading manipulator, and adjusting the vacuum sucker of the unloading manipulator to be opposite to the chip placement slot on a right side of the turntable; controlling the unloading manipulator to move to the turntable until the vacuum sucker of the unloading manipulator adsorbs the chip that has been detected on the turntable; a vacuum degree of the vacuum sucker of the unloading manipulator being greater than that of the turntable; reading the detection result, and controlling the unloading manipulator to move above the corresponding distribution tray according to the detection result; controlling the unloading manipulator to move downward, and when the vacuum sucker of the unloading manipulator is located at an upper part of the distribution tray, turning off the negative-pressure gas source of the unloading manipulator, so that the chip falls into the distribution tray; Step D: when a side of the turntable, where there is a chip remaining in the chip placement slot that is stuck or not be adsorbed, rotates to a horizontal plane at a lower part of the turntable, discharging the remained chip into a flash box by the positive-pressure gas source introduced into the main gas hole at the lower part of the turntable; Step E: after all of the chips on the chip tray are detected, a lifting driving device lifts a lifting platform, the lifting platform lifts the transfer tray, and the transfer tray holds up the detected chip tray inside the cabinet and the undetected chip tray outside the cabinet to separate the detected chip tray from the chip tray bracket; the rotating device drives the transfer tray to rotate by 180 degrees, so that the chip trays inside and outside the cabinet exchange positions; the lifting driving device drives the lifting platform to descend, and the transfer tray descends along with the lifting platform to place the undetected chip tray onto the chip tray bracket.

The technic effects of the present disclosure include:

1. The present disclosure greatly improves the working efficiency by completing the placement, detection and removal of the chip during the rotation of the turntable.

2. In the present disclosure, the chip detection device is provided with a cavity to accommodate the probe, and inert gas is introduced into the cavity to protect the chip during the detection if the chip, so as to prevent sparks when the probe contacts the chip during the detection, thereby improving the quality of the chip.

3. In the present disclosure, the chip detection system is provided with a controller connected to the loading manipulator, the unloading manipulator and the chip detection device. Therefore, during the rotation of the turntable, the filling, detection and classification of the chips are all automatically completed under the control of an automatic control program, which achieves the advantageous effect of being quicker and more efficient than the manual operation and pipeline operation in the prior art.

4. In the present disclosure, by being provided with a flash box, the chip detection system can prevent the chip from being stuck in the chip placement slot, which improves the utilization rate of the chip placement slot, and reduces the damage and waste of the chip.

5. In the present disclosure, by being provided with a rotatable feeding platform, the chip detection system can realize automatic feeding, and a worker only needs to regularly replace the external empty chip tray, which reduces the labor cost and labor intensity of the worker.

BRIEF DESCRIPTION OF THE DRAWINGS

The following drawings are only intended to schematically illustrate and explain the present disclosure, rather than limiting the scope of the present disclosure. In the drawings.

DETAILED DESCRIPTION

For a clear understanding of the technical features and effects of the present disclosure, specific embodiments of the present disclosure will now be described in detail below.

It is a first aspect of the present disclosure to provide a chip detection device, including a support plate 100, a probe holder 110 disposed on an upper part of the support plate 100, a first driving device 120 which drives the probe holder 110 to move longitudinally, and a detection platform erected on the support plate 100.

Figure 1:
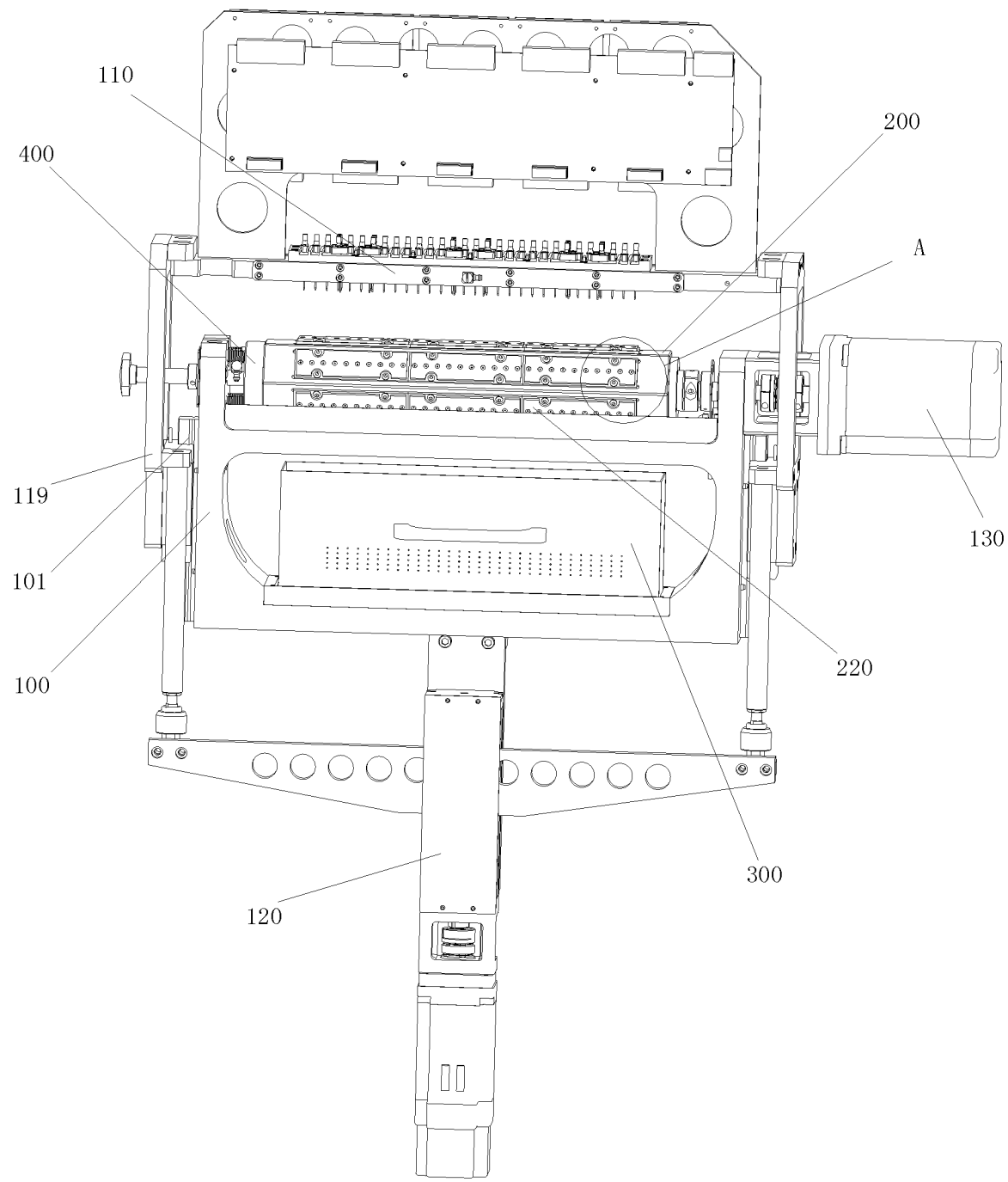
FIG. 1 is a perspective view of a chip detection device according to an embodiment of the present disclosure.

In an embodiment of the present disclosure, the support plate 100 is configured to erect the detection platform. There are two support plates 100 which are plate-shaped, and the planes on which the two support plates 100 are located are parallel. The two support plates 100 may be disposed on a base to ensure the stability. As illustrated in FIG. 1, the two support plates 100 are integrally formed with the base to form a frame structure with a U-shaped cross-section, which includes a base part and two vertical support parts. Preferably, in order to maintain the stability, a connecting rod is disposed between the two support plates 100.

In an embodiment of the present disclosure, a chip to be detected is placed on the detection platform. When the chip is rotated to an uppermost part, a probe descends to be combined with the chip, and then a detection is carried out on the chip. In order to control the longitudinal movement of the probe, the first driving device 120 is provided on an outer side of the support plate 100. The first driving device 120 has a linear motion function. For example, the first driving device 120 may be an electrical push rod, an electro-hydraulic push rod, a linear motor, etc., or a gas cylinder or a hydraulic cylinder push rod. In this embodiment, in order to keep the probe holder 110 being horizontal, lifting distances of the support plates 100 on both sides are consistent with each other, the first driving device 120 is disposed at the lower parts the two support plates 100, and fixedly connected to the two support plates 100 to maintain the stability. Specifically, the first driving device 120 is a linear motion driving device composed of an electrical lead screw and a slider. A slide rail 101 and a lifting connection plate 119 are disposed on the outer side of the support plate. A length direction of the slide rail 101 is vertical, a middle part of the lifting connection plate 119 is slidably connected to the slide rail 101, and an upper part of the lifting connection plate 119 is fixedly connected to the probe holder 110. The probe holder 110 is erected between the two lifting connection plates 119. Lower ends of the two lifting connection plates 119 are connected to each other by a cross beam 140, and a middle part of the cross beam 140 is fixedly connected to the slider of the first driving device 120. After the first driving device 120 is started, the electrical lead screw rotates to drive the slider to move longitudinally, and then the probe holder 110 is lifted through the landing connection plate 119.

In an embodiment of the present disclosure, the probe holder 110 is configured to support the probe, which includes a test probe head and a common-end probe head. The detection platform is located below the probe holder 110, with their length directions parallel to each other. The detection platform and the probe holder 110 opposite each other longitudinally. After the probe holder 110 descends, the probe on the probe holder 110 contacts the chip on the chip test tray 220. In this case, the test probe head is connected to an upper part of the chip, and the common-end probe head is connected to the chip test tray 220, which is connected to a lower part of the chip, so that a power-on detection can be realized.

In an embodiment of the present disclosure, the probe holder 110 is further provided with a test control circuit. The test control circuit may be disposed outside the main body of the probe holder 110 and connected by wires. Considering that a long signal transmission distance during the detection will lead to a big error in the detection result, the test control circuit is disposed at an upper part of the probe holder 110 to realize a nearby detection. The detection result is stored or transmitted to other devices through a communication line.

In an embodiment of the present disclosure, considering that sparks will be generated when the probe contacts the chip instantaneously during the chip detection, which will affect the quality of the chip, inert gas protection is adopted to prevent the sparks. Therefore, the probe on the probe holder 110 is disposed in a cavity 115 which is communicated with a positive-pressure inert gas source. The cavity 115 is opened (i.e., has an opening) on a side where the probe head is located. Since the cavity 115 is connected to the positive-pressure inert gas source, oxygen in the cavity 115 is driven away by the inert gas, and the concentration of the oxygen in the cavity 115 is reduced, which prevents the sparks from being generated when the probe contacts the chip, so as to ensure the quality of the chip.

Figure 7:
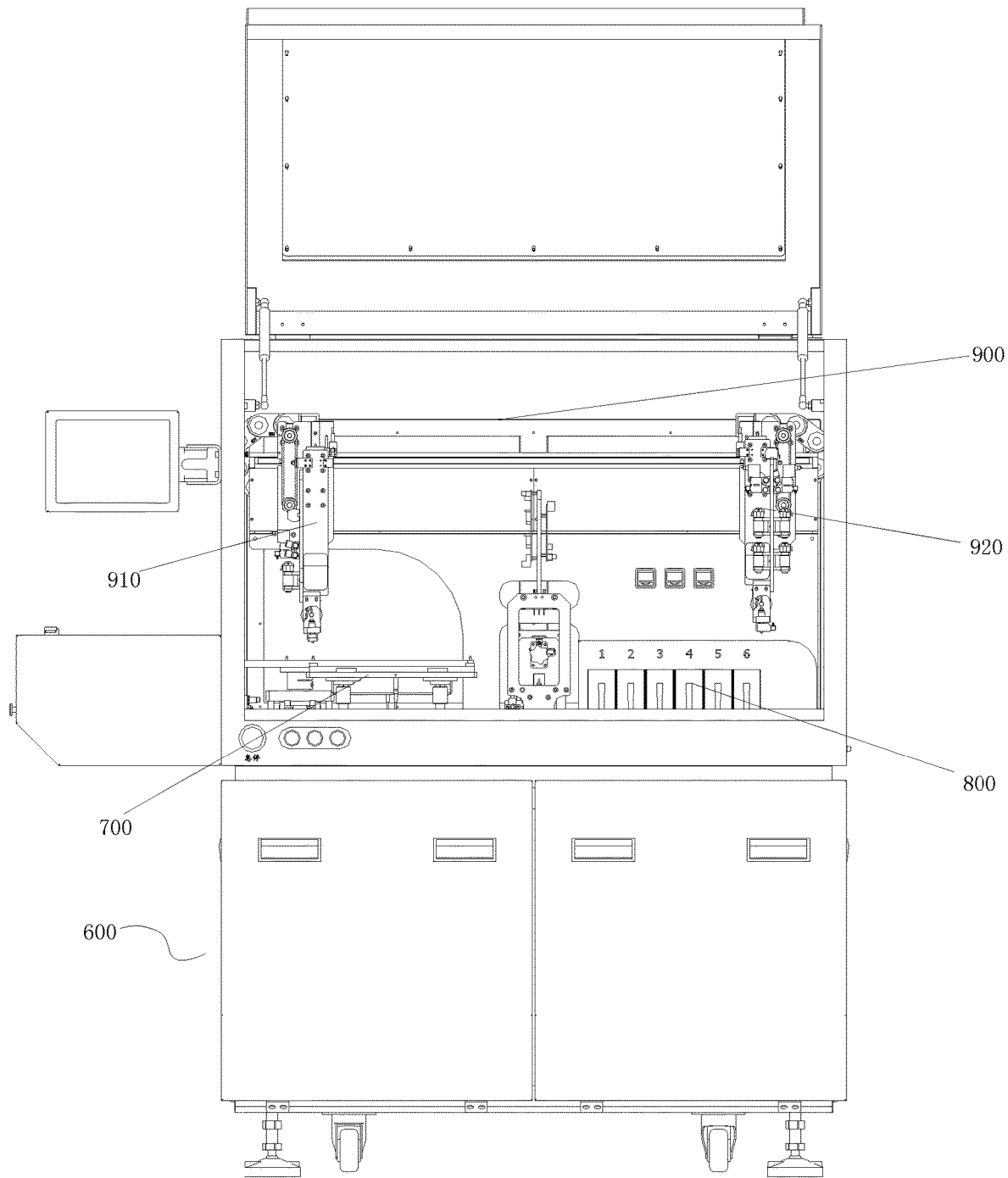
FIG. 7 is a schematic diagram of a chip detection system according to an embodiment of the present disclosure.
Figure 10:
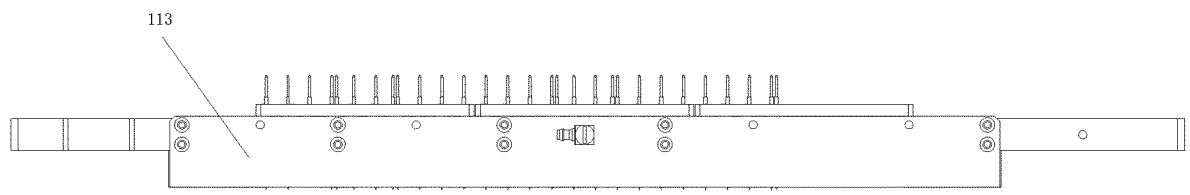
FIG. 10 is a front view of a probe holder according to an embodiment of the present disclosure.
Figure 11:
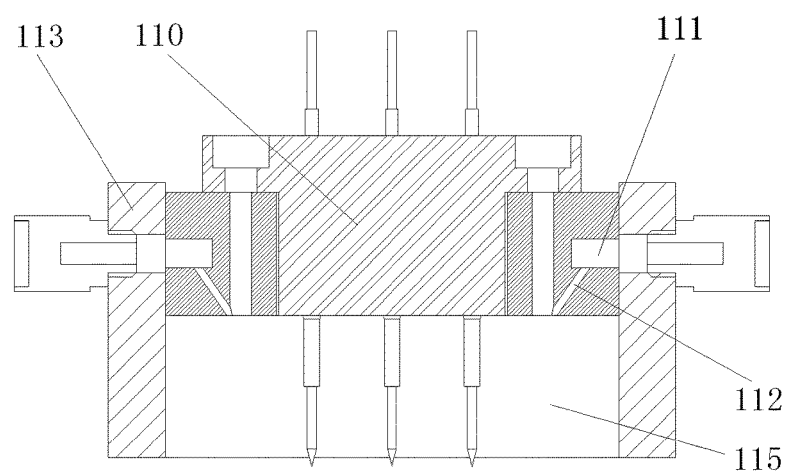
FIG. 11 is a cross-sectional view of the probe holder according to an embodiment of the present disclosure.

In an embodiment of the present disclosure, as illustrated in FIGS. 10 and 11, the cavity 115 is surrounded by the probe holder 110 and an enclosure 113 disposed on a periphery thereof. In order to conduct the inert gas, the enclosure 113 or the probe holder 110 is provided with a main protective gas hole 111 and a gas dispersion hole 112, and a length direction of the main protective gas hole 111 is parallel to a length direction in which the probes are arranged. The gas dispersion hole 112 communicates the main protective gas hole 111 and the cavity 115, and the main protective gas hole 111 is communicated with the positive-pressure inert gas source. The enclosure 113 is strip-shaped and perpendicular to the probe holder. The enclosure 113 is connected to the probe holder by screwing or clamping. The enclosure 113 is disposed around the probe and closed in a peripheral direction, and an inner side of the enclosure 113 forms the cavity 115 with the lower part opened. As illustrated in FIG. 7, in this embodiment, the main protective gas hole 111 is disposed at the upper part of the probe holder 110, and the enclosure 113 is provided with a gas inlet interface communicated with the main protective gas hole 111. In order to disperse the inert gas while ensuring the content thereof at a part where the probe contacts the chip, a lower part of the gas dispersion hole 112 is inclined toward an end of the probe. The main protective gas hole 111 is communicated with the external positive-pressure inert gas through the gas inlet interface disposed on the probe holder 110 or the enclosure 113. Preferably, nitrogen is used as the positive-pressure inert gas.

In an embodiment of the present disclosure, in order to seal the cavity 115 while ensuring a good contact between the probe and the chip, a distance between a lower end of the enclosure 113 and a bottom surface of the probe holder 110 is slightly smaller than that between a bottom end of the probe and the bottom surface of the probe holder 110. For example, the distance between the lower end of the enclosure 113 and the bottom surface of the probe holder is 3 mm to 5 mm smaller than that between the bottom end of the probe and the bottom surface of the probe holder 110.

Alternatively, the upper part of the enclosure 113 is longitudinally slidably connected to the probe holder 110. When the first driving device 120 drives the probe holder 110 to descend toward the chip test tray 220, the enclosure 113 abuts against the chip test tray 220 to reliably seal the cavity 115 and increase the concentration of inert gas in the cavity 115, and then the probe holder 110 continues to descend to be in contact with a chip for detection.

In an embodiment of the present disclosure, in order to ensure the concentration of the inert gas in the cavity 115, the length directions of at least two gas dispersion holes 112 are inclined toward the probe head. In this case, the gas is blown to the probe head, so the probe head is in the inert gas when contacted with the chip.

In an embodiment of the present disclosure, the detection platform is configured to continuously detect the chips, and mainly includes a turntable 200, a vacuum ring 400 and a second driving device 130.

In an embodiment of the present disclosure, the turntable 200 has a cylinder shape, and at least three groups of uniformly distributed chip test trays 220 are disposed on a cylindrical surface of the turntable 200. Each group of chip test trays 220 comprises a plurality of chip test trays 220. The length direction of the chip test tray 220 is the same as an axial direction of the turntable 200, and each group of chip test trays 220 are arranged in a row in the length direction on the cylindrical surface of the turntable 200.

Figure 2:
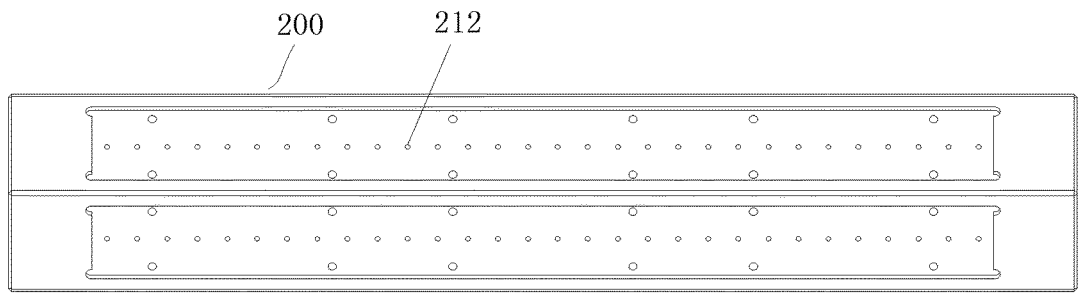
FIG. 2 is a front view of a turntable according to an embodiment of the present disclosure.

In an embodiment of the present disclosure, the chip test tray 220 has a rectangular shape, and the length direction of the chip test tray 220 coincides with the axial direction of the turntable 200. In order to increase the structural strength of the turntable 200, the material of the turntable 200 is generally metal. In order to prevent the chip test tray 220 from being electrically conductive, the chip test tray 220 is designed in a multilayer structure. A lower part of the chip test tray 220 is made of an insulating material to be in contact with the turntable 200, and a middle part or an upper part of the chip test tray 220 is embedded with a metal material for electrical conduction. The chip test tray 220 is provided with a chip placement slot 222 for placing the chips. As a common end of the chip test tray 220, the chip placement slot 222 is set in the metal material. The chip placement slot 222 in the chip test tray 220 needs to supply power to the chip, so all of the chip placement slots 222 are conductors and electrically connected as the common end for the chip detection. One of the probes is in contact with the chip placement slot alone to realize the electrical connection of the common end. The length of the chip test tray 220 may be slightly smaller than that of the turntable 200, i.e., one chip test tray 220 may be disposed within a radian range on the side surface of the turntable 200. For example, the length of the chip test tray 220 is 3 mm to 5 mm shorter than that of the turntable 200. In order to keep the chip being stably adsorbed, an adsorption through hole 221 is formed in the middle part of the chip placement slot 222 and communicated with a branch gas hole 212 in the turntable 200, as illustrated in FIG. 2. Preferably, in order to reduce the gas source waste and save energy, the adsorption through hole 221 is hermetically connected to the branch gas hole 212.

In the prior art, each chip is detected alone, i.e., the test probe is charged separately for the test, and this cyclic detection method takes a long time. In order to improve the detection speed, the chip test trays 220 are disposed in a plurality of groups each having a plurality of chip test trays 220, i.e., a plurality of chip test trays 220 arranged in a row are disposed in a length direction parallel to an axial direction of the cylindrical surface of the turntable 200, so the chips in each of the chip test trays 220 are detected simultaneously, thereby significantly improving the detection efficiency. For example, the chip test trays 220 are provided in at least three groups each having a plurality of chip test trays 220, and the plurality of chip test trays 220 of each group are sequentially arranged in a row in the length direction of the turntable 200.

Figure 12:
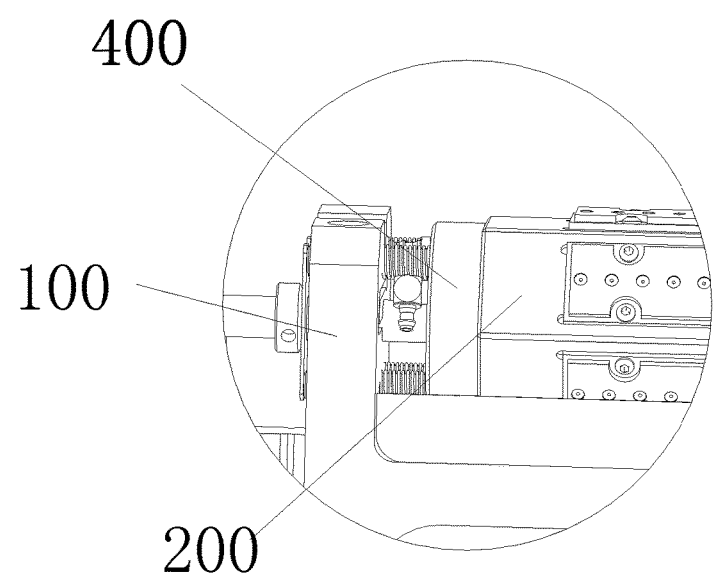
FIG. 12 is an enlarged view of a connection part where the vacuum ring and the turntable are connected in the present disclosure.

In an embodiment of the present disclosure, two ends of the turntable 200 in the length direction are rotatably connected to the support plates 100. As illustrated in FIG. 1, the two ends of the turntable 200 are extended with fixing shafts or connected thereto, and the support plate 100 is provided with bearing fixing seats for mounting the fixing shafts. As illustrated in FIG. 12, the fixing shaft at one end of the turntable 200 passes through the vacuum ring 400 and is rotatably connected to the support plate 100, and the fixing shaft at the other end of the turntable 200 is connected to a rotation output mechanism of the second driving device 130. In an embodiment, the second driving device 130 is a motor, and the fixing shaft at the other end of the turntable 200 is fixedly connected to the rotating shaft of the motor.

In an embodiment of the present disclosure, the turntable 200 may be a cylinder, and the chip test tray 220 is provided on a cylindrical surface of the turntable 200. A side surface of the chip test tray 220 in contact with the turntable 200 may be designed as a cambered surface with a same curvature as that of the turntable 200 for an adhesion, and the turntable 200 and the chip test tray 220 may be connected by screws.

Figure 3:
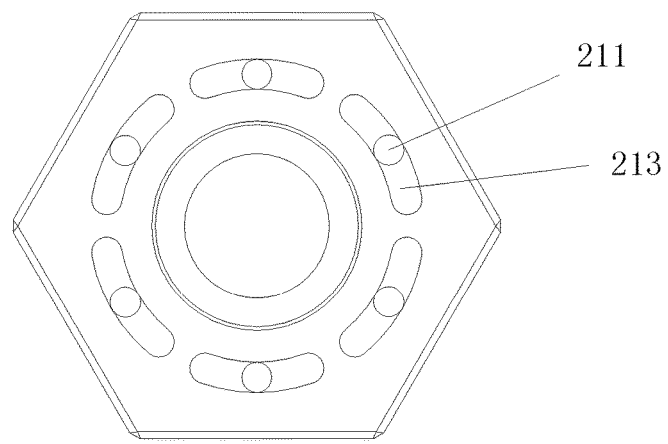
FIG. 3 is a left view of the turntable according to an embodiment of the present disclosure.

In an embodiment of the present disclosure, in order to facilitate the mounting of the chip test tray 220, the turntable 200 may be a regular polyhedral cylinder with at least three side surfaces. Preferably, the turntable 200 is designed as a regular hexagonal cylinder or a regular octahedral cylinder. The chip test tray 220 is mounted on each side surface of the regular polyhedral cylinder. As illustrated in FIG. 3, in an embodiment the turntable 200 is a regular hexagonal cylinder, which is also an optimum design scheme.

In the rotation process of the turntable 200, and in the process of placing, removing and detecting the chips, the chips on the chip test tray 220 may fall off. In order to collect the fallen chips, a flash box 300 is provided below the turntable 200. The flash box 300 is a strip-shaped rectangular box, with two ends fixedly or detachably connected to the two support plates 100, respectively. The flash box 300 has an upward opening to collect the fallen chips. As illustrated in FIG. 1, the flash box 300 is located below the turntable 200, and the opening of the flash box 300 faces the turntable 200.

In an embodiment of the present disclosure, a plurality of rows of chip test trays 220 are disposed on each side surface of the turntable 200 or within a radian range of the side surface, so as to improve the chip detection efficiency. Further, the chip test tray 220 is provided with a plurality of, preferably two or three, rows of chip placement slots 222. Correspondingly, as illustrated in FIG. 2, the turntable 200 is provided with the branch gas holes 212 in the same number as the chip placement slots 222 to be communicated with the adsorption through holes 221 of the chip placement slots 222.

Figure 4:
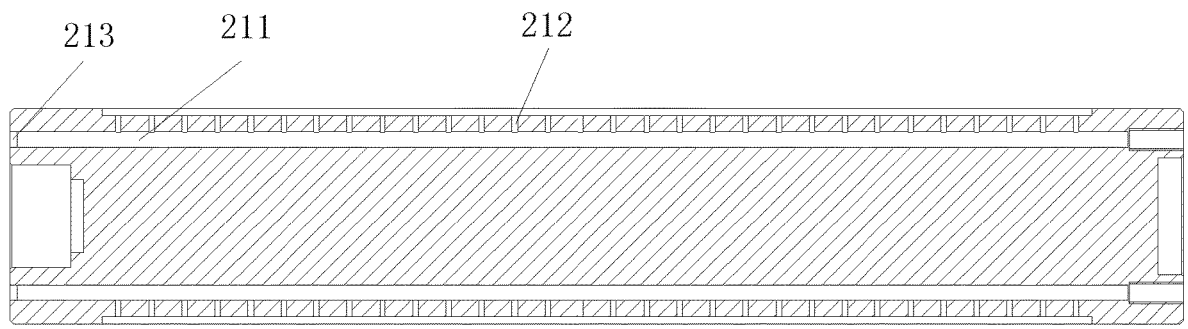
FIG. 4 is a cross-sectional view of the turntable according to an embodiment of the present disclosure.

In an embodiment of the present disclosure, in order to conduct the gas source and fix the chip by vacuum adsorption, the turntable 200 is provided with main gas holes 211 with a length direction parallel to the axial direction of the turntable 200, as illustrated in FIG. 4, and the number of the main gas holes 211 is the same as that of the groups of the chip test trays 220. The main gas holes 211 and the chip test trays 220 are on a one-to-one basis in radial directions of the turntable 200. An orifice in an end face of the main gas hole 211 of the turntable 200 close to the vacuum ring 400 is opened, and the other orifice of the main gas hole 211 is closed. Each group of chip test trays 220 and the corresponding main gas hole 211 are located in the same radial direction of the turntable 200.

Figure 5:
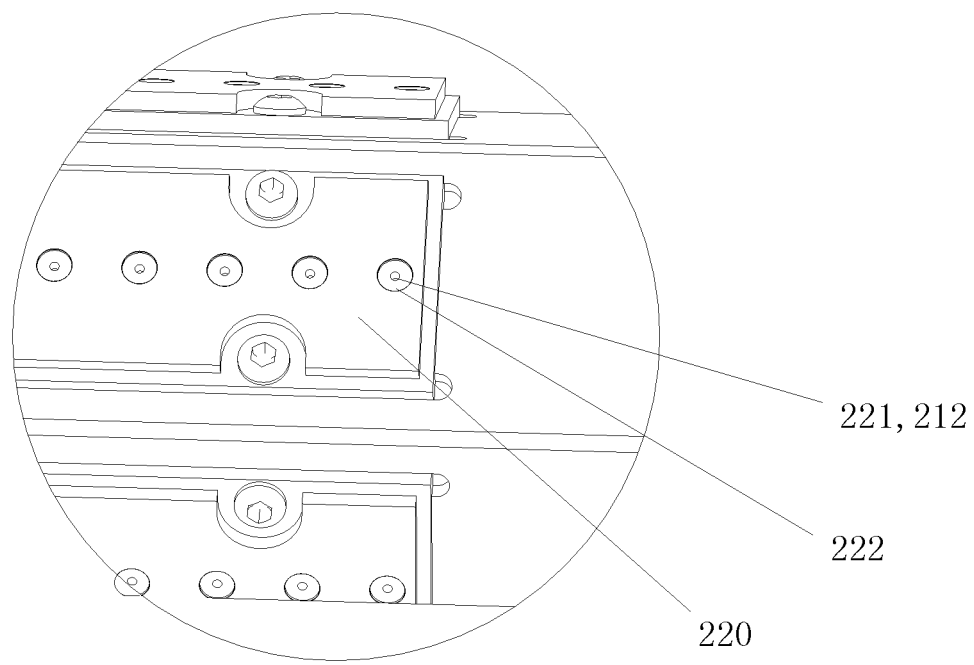
FIG. 5 is a partial enlarged view of area A in FIG. 1.

In an embodiment of the present disclosure, as illustrated in FIGS. 4 and 5, in order to supply gas to each of the chip placement slots 222, the turntable 200 is further provided with branch gas holes 212. The branch gas hole 212 communicates the main gas hole 211 and the adsorption through hole 221 of the chip test tray 220. Alternatively, each of the main gas holes 211 is corresponding to two adjacent groups of chip test pads 220, and is provided with two groups of branch as holes 212.

The present disclosure achieves a continuous detection by rotating the turntable 200, so the second driving device 130 is required to drive the turntable 200 to rotate. The second driving device 130 is a rotatable driving device, such as a stepping motor, a servo motor, a reluctance motor, etc., and a pneumatic rotatable driving device may also be adopted. The second driving device 130 is disposed on the other support plate 100, and the rotating shaft thereof is connected to the turntable 200 directly or through a reducer, a coupler, etc., to drive the turntable 200 to rotate. In order to improve the stability, the rotating shaft of the second driving device 130 is rotatably connected to the support plate 100 through a bearing.

In an embodiment of the present disclosure, the second driving device 130 is configured to drive the turntable 200 to rotate, and the vacuum ring 400 is configured to conduct the gas source. In an embodiment of the present disclosure, the vacuum ring 400 is annular, with a middle part through which a fixing shaft for fixing the turntable 200 passes, and the fixing shaft is rotatably connected to the support plate 100 through a bearing. One end face of the vacuum ring 400 is fixedly connected to the support plate 100, and the other end face thereof is hermetically and rotatably connected to the end face of the turntable 200. A surface of the vacuum ring 400 abutting against the turntable 200 is a mirror surface coated with lubricating grease. The vacuum ring 400 is provided with a screw hole, through which the vacuum ring 400 is mounted onto the upper part of the support plate 100. The vacuum ring 400 serves as a valve to control the gas source in the main gas hole 211.

Figure 6:
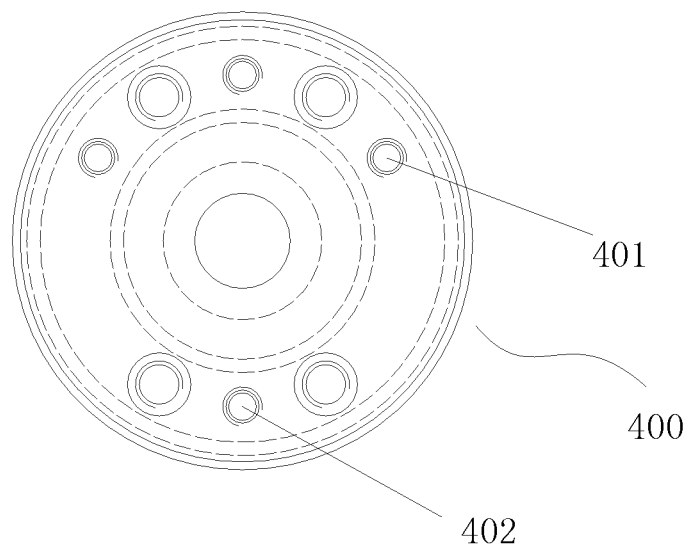
FIG. 6 is a schematic diagram of a vacuum ring according to an embodiment of the present disclosure.

In an embodiment of the present disclosure, as illustrated in FIG. 6, the vacuum ring 400 is provided with a negative-pressure gas hole 401 for gas communication with the main gas hole 211. One orifice of the negative-pressure gas hole 401 is located on an end face of the vacuum ring 400 abutting against the turntable 200 and on a same circumference with the main gas hole 211, and the other orifice of the negative-pressure gas hole 401 is connected the negative-pressure gas source. For the convenience of control, the negative-pressure gas hole 401 is connected to the negative-pressure gas source through an electrically controlled gas valve.

Since the turntable 200 rotates during working, the main gas hole 211 and the negative-pressure gas hole 401 sometimes face each other and sometimes stagger. In an embodiment of the present disclosure, in order to ensure continuous gas communication, a communication slot 213 is disposed at the orifice of the negative-pressure gas hole 401 or the orifice of the main gas hole 211, for a communication between the negative-pressure gas hole 401 and the main gas hole 211 when the two are staggered.

When the communication slot 213 is disposed on the turntable 200, the shape of the orifice of the main gas hole 211 or the cross-sectional shape of the main gas hole 211 may be the same as the shape of the communication slot 213.

In an embodiment of the present disclosure, the vacuum ring 400 may be provided with one negative-pressure gas hole, and in this case, the communication slot 213 at the position of the main gas hole 211 is annular. The width of the communication slot 213 is greater than or equal to the diameter of the main gas hole 211.

In this case, the vacuum ring may be further provided with a positive-pressure gas hole 402. The negative-pressure gas hole 401 and the positive-pressure gas hole 402 are symmetrically disposed up and down. The positive-pressure gas hole 402 is connected to a positive-pressure gas source. In this case, the communication slot 213 is disposed on the vacuum ring 400. A radian of the communication slot 213 corresponding to the negative-pressure gas hole 401 is greater than 180 degrees, and a radian of the communication slot corresponding to the positive-pressure gas hole 402 is less than D, D=360/n, where n is the number of the main gas holes 211. Therefore, regardless of the number of the main gas holes 211, the lowermost main gas hole 211 is communicated with the positive-pressure gas source for blowing off the chip stuck in the chip placement slot 222.

In another embodiment of the present disclosure, the vacuum ring 400 is provided with three negative-pressure gas holes 401. When one of the chip test trays 220 rotates along with the turntable 200 to a horizontal position of the upper part of the turntable 200, one of the main gas holes 211 is located at a highest point of the upper part, and the three negative-pressure gas holes 401 are corresponding to a main gas hole 211 at the upper part and two main gas holes 211 adjacent thereto, i.e., the negative-pressure gas holes 401 are communicated with three main gas holes 211 at the upper part. The negative-pressure gas hole 401 is connected to the negative-pressure gas source, or communicated therewith through a gas valve. In this case, the communication slot 213 at the position of the main gas hole 211 is cambered, and a distance between the two communication slots 213 is greater than a radius of the negative-pressure gas hole 401 and smaller than a diameter of the negative-pressure gas hole 401.

In this case, the vacuum ring 400 may be further provided with a positive-pressure gas hole 402. When one of the chip test trays 220 rotates along with the turntable 200 to a horizontal position of the upper part of the turntable 200, i.e., when one of the chip test trays 220 faces the probe holder 110, the three negative-pressure gas holes 401 are corresponding to a main gas hole 211 at the upper part and two main gas holes 211 adjacent thereto, while the positive-pressure gas holes 402 is corresponding to the main gas hole 211 that corresponds to the flash box 300. Therefore, the positive-pressure gas source can blow the chip left or stuck in the chip placement slot 222 into the flash box 300 through the positive-pressure gas hole 402.

In an embodiment, during the operation of the chip detection device of the present dis, the turntable 200 is driven by the second driving device 130 to rotate. Since the main gas hole 211 located at the upper part of the turntable 200 is connected to the negative-pressure gas source through the vacuum ring 400, the chip can be adsorbed in the chip placement slot 222. The chip may be placed in the chip placement slot 222 manually or by an automated mechanical structure. In an example where the turntable 200 has a horizontal axis and rotates clockwise, the principle of placement is that the chip is placed on a left side of the turntable 200 in a vertical direction when viewed from the end face of the turntable 200; when the chip is rotated to the uppermost part of the turntable 200, the first driving device 120 drives the probe holder 110 to descend; since the probe on the probe holder 110 is corresponding to the chip placement slot 222, the probe comes in contact with the chip, thus realizing an electrical conduction and a test. The turntable 200 may be rotated step by step, and the chip may be detected when the turntable 200 stops. After the detection, the chip that has been detected is rotated along with the turntable 200 to a right side of the turntable 200 in the vertical direction, and then the chip is removed manually or mechanically. Preferably, in order to realize an automatic control, the present disclosure may be electrically connected to a PLC controller that is electrically connected to electrical components in the present disclosure, including the first and second driving devices, the probe, the detection circuit, etc.

In an embodiment of the present disclosure, in order to improve the stability, a shading sheet is disposed on the rotating shaft of the turntable 200, and is provided with a slit at a position corresponding to a center line of the side surface of the turntable 200. Meanwhile, a through-beam detection device is set to detect the position of the turntable 200, and the rotation of the turntable 200 is suspended for a short time during the detection.

In order to improve the efficiency, a mechanical arm is now usually adopted to load and unload the chip. During the actual operation, due to various reasons, the chip may be stuck in the chip placement slot 222. In order to remove the stuck chip, when the chip placement slot 222 rotates along with the turntable 200 to a horizontal position of the lower part of the turntable 200, the positive-pressure gas hole 402 is communicated with the main gas hole 211 at the lower part, and the gas is blown out from the main gas hole 211, so that the chip can be blown into the flash box 300.

It is a second aspect of the present disclosure to provide a chip detection system, as illustrated in FIG. 7, including a cabinet 600 internally provided with a controller, a loading manipulator 910, an unloading manipulator 920, a chip tray bracket 700 disposed on a side of the loading manipulator 910, and a distribution tray 800 disposed on a side of the unloading manipulator 920. The loading manipulator 910 and the unloading manipulator 920 are configured to adsorb and grab the chip. A chip detection device is disposed between the loading manipulator 910 and the unloading manipulator 920, the loading manipulator 910 places the chip from the chip tray bracket 700 onto the chip detection device, and the unloading manipulator 920 removes the chip from the chip detection device and places it in the corresponding distribution tray 800.

In an embodiment of the present disclosure, the chip detection device includes support plates 100 fixedly connected to the cabinet 600, a detection platform erected between two of the support plates 100, a probe holder 110 disposed above the detection platform, a first driving device 120 disposed on the support plate 100 and capable of driving the probe holder 110 to move up and down, and a second driving device 130 disposed on the support plate 100 and capable of driving the detection platform to rotate. In order to realize the above operations, the controller is electrically connected to the loading manipulator 910, the unloading manipulator 920 and the chip detection device, and controls the loading manipulator 910 to place a chip from the chip tray carrier 700 onto the rotatable detection platform; when the chip is rotated to face the probe holder 110, the probe holder 110 descends to detect the chip; then the controller controls the unloading manipulator 920 to remove the chip that has been detected from the detection platform and place it in the corresponding distribution tray 800.

In an embodiment of the present disclosure, the support plate 100 is configured to erect the detection platform, and is fixedly connected to the cabinet 600. Specifically, a horizontal platform is disposed in the middle of the cabinet 600, and a bottom of the support plate 100 is mounted on the horizontal platform. There are two support plates 100 which are plate-shaped. The planes on which the two support plates 100 are disposed are parallel. The two support plates 100 may be disposed on a base to ensure the stability. As illustrated in FIG. 1, the two support plates 100 are integrally formed with the base to form a frame structure with a U-shaped cross-section, which includes a base part and two vertical support parts. Preferably, in order to maintain the stability, a connecting rod is disposed between the two support plates 100.

In an embodiment of the present disclosure, the first driving device 120 is disposed at the lower parts of the two support plates 100. In other words, the first driving device 120 is disposed at a lower part of the horizontal platform in the middle of the cabinet 600. A through hole is formed in the horizontal platform to place the lifting connection plate 119, and the first driving device 120 is fixedly connected to a lower part of the cabinet 600.

Other structures, working principles and technical effects of the chip detection device in this aspect of the present disclosure are the same as those in the first aspect of the present disclosure, and will not be repeated here.

Figure 8:
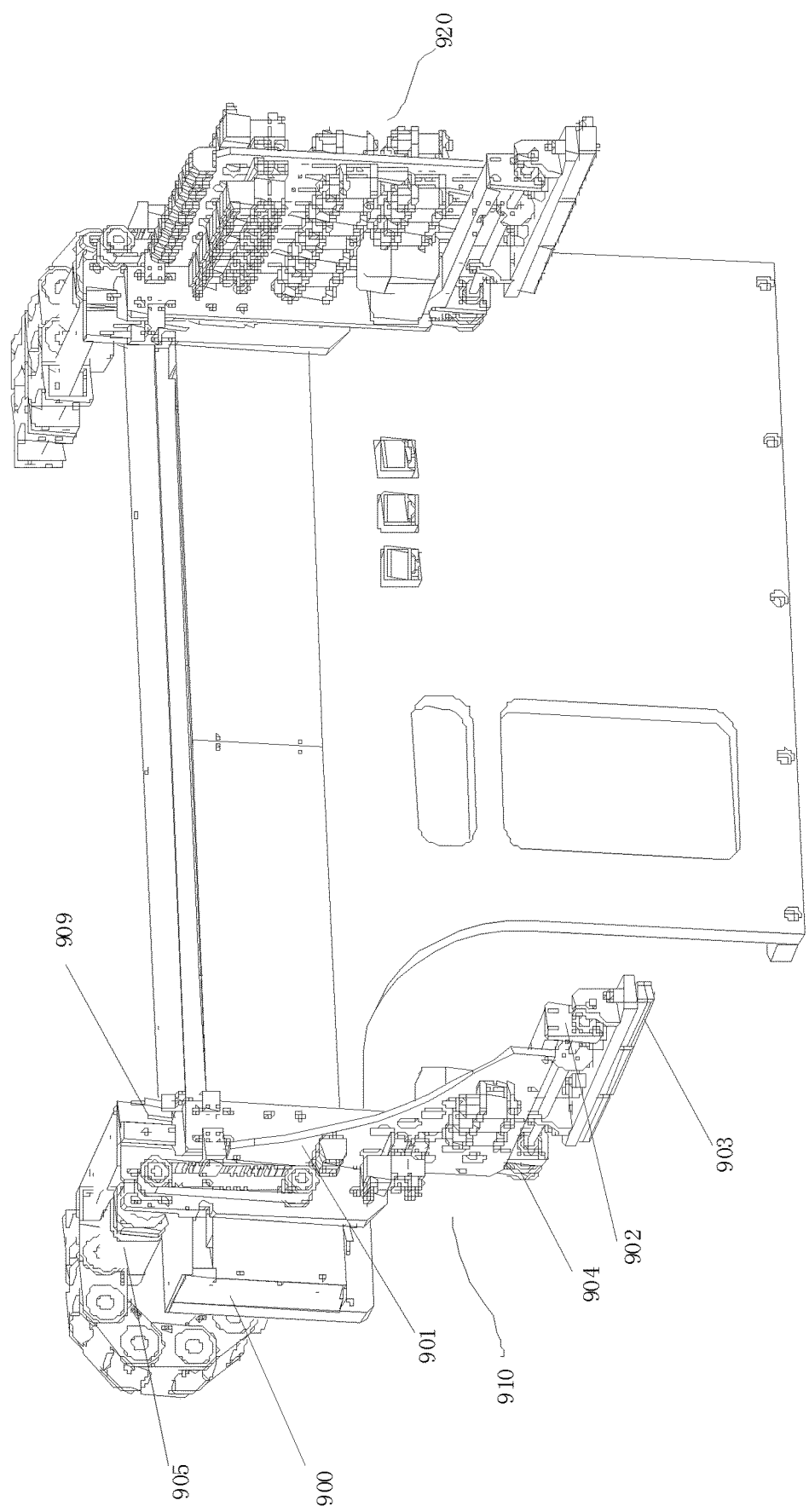
FIG. 8 is a schematic diagram of a vacuum manipulator according to an embodiment of the present disclosure.

In an embodiment of the present disclosure, the chip detection device is located at a middle part of the horizontal platform in the middle of the cabinet 600, as illustrated in FIG. 8, and the loading manipulator 910 and the unloading manipulator 920 are located on two sides of the chip detection device, respectively. The loading manipulator 910 and the unloading manipulator 920 have the same structure. The loading manipulator 910 is a vacuum adsorption type manipulator.

In an embodiment of the present disclosure, the loading manipulator 910 includes a horizontal moving module, a longitudinal moving module disposed on the horizontal moving module, and a rotating module disposed at a lower end of the longitudinal moving module. The rotating module is provided with an adsorption module 903, and the longitudinal moving module is provided with a gas valve having one end communicated with the adsorption module 903 and the other end connected to a gas source.

In an embodiment of the present disclosure, as illustrated in FIG. 8, the horizontal moving module includes a horizontal slide rail 900, a horizontal slider 909 and a horizontal driving device. The horizontal slider 909 is slidably connected to the horizontal slide rail 900, and the horizontal driving device drives the horizontal slider 909 to move horizontally on the horizontal slide rail 900. The driving of a linear motion is to a mature technology, and a linear motor is adopted in this embodiment to realize the driving of the linear motion. Although not illustrated, the horizontal driving device is disposed inside the horizontal slide rail 900.

In an embodiment of the present disclosure, the longitudinal moving module includes a longitudinal sliding arm 901 and a longitudinal driving device 905. The longitudinal sliding arm 901 is longitudinally and slidably connected to the horizontal slider 909, and the longitudinal driving device 905 drives the longitudinal sliding arm 901 to move longitudinally. An upper end of the longitudinal sliding arm 901 is slidably connected to the horizontal slider 909, and the longitudinal driving device 905 is disposed on the horizontal slider 909 to drive the longitudinal sliding arm 901 to slide longitudinally. For example, the longitudinal driving device 905 is a linear motion driving device.

In an embodiment of the present disclosure, the rotating module includes an operating arm 902, an adsorption module 903 and a driving device. The driving device and the operating arm are disposed at a lower part of the longitudinal sliding arm 901, the operating arm 902 is rotatably connected to a lower end of the longitudinal sliding arm 901, and a rotation driving device 904 drives the operating arm 902 to rotate. Since the chip is located on a horizontal plane of the chip tray bracket 700, the chip test tray 220 may be located on a vertical plane or an inclined plane, so it is necessary to rotate the operating arm 902 to adsorb the chip form the chip tray bracket 700 and place it on the chip test tray 220. The adsorption module 903 is disposed at an end of the operating arm 902, an upper end of the adsorption module 903 is provided with a gas inlet hole, and a lower end of the adsorption module 903 is provided with a vacuum sucker. The driving device further includes a gas valve to control the on-off of the gas source of the gas inlet hole. Preferably, in order to realize the gas intake and ejection, the gas valve may be a two-way switching valve or a three-way valve. Two gas valves may be set to connect the positive-pressure gas source and the negative-pressure gas source, respectively. In this case, after the chip is adsorbed, the positive-pressure gas source is adopted to blow out the adsorbed chip to prevent the chip from being missed or stuck on the vacuum sucker. In order to control the gas source, the longitudinal sliding arm 901 is provided with a gas valve, which is an electrical gas valve or an electromagnetic gas valve, and the on-off of the gas valve is controlled by a controller. One end of the gas valve is connected to the gas source, and the other end thereof is communicated with the adsorption module.

In an embodiment of the present disclosure, the unloading manipulator 920 removes the chip from the turntable 200 and places the chip in the distribution tray 800 which is a box with an open upper part. The distribution trays 800 are disposed in parallel on a right side of the chip detection device, and preferably, the distribution trays 800 are disposed side by side. The unloading manipulator 920 passes above all of the distribution trays 800 until reaching the corresponding position, where the gas source is switched to blow the chip into the distribution tray 800. Preferably, in order to realize buffering, the upper part of the distribution tray 800 is provided with an inclined slide plate, which is inside the distribution tray 800 and fixedly connected to an inner wall of the distribution tray 800. After the unloading manipulator 920 adsorbs the chip, the vacuum sucker is rotated to face the inclined slide plate inside the distribution tray 800. When the vacuum sucker of the unloading manipulator 920 moves to the upper part of the distribution tray 800, the vacuum sucker of the unloading manipulator 920 has an included angle, preferably from 30 to 80 degrees, with the inclined slide plate, so as to prevent the chip from directly impacting the distribution tray 800 or the chip therein. The chip is blown to fall onto the inclined slide plate, and then slides down along the inclined slide plate to realize buffering.

In an embodiment of the present disclosure, in order to facilitate the replacement of a chip tray on the chip tray bracket 700, such as the removal of an empty chip tray after the detection and the placement of a new chip tray, a feeding device is disposed at a lower part of the chip tray bracket 700 of the cabinet 600. In order to facilitate the replacement of the chip tray, the cabinet 600 is provided with a notch corresponding to the chip tray bracket 700, and the chip tray bracket 700 extends to the outside of the cabinet 600 through the notch. The chip tray may be pushed into or taken out of the cabinet 600 from the notch. The chip tray bracket 700 has one end inside the cabinet 600 and the other end outside the cabinet 600. The main body of the chip tray bracket 700 is frame-shaped, i.e., the middle part of the chip tray bracket 700 is provided with an opening, and two ends of the chip tray bracket 700 support the chip tray.

In an embodiment of the present disclosure, a transfer tray 520 is embedded in the opening of the chip tray bracket 700. When the chip tray needs to be replaced, the transfer tray 520 rises and lies on a different plane relative to the chip tray bracket 700. Therefore, the positions of two ends of the transfer tray 520 may be exchanged by rotating the transfer tray 520, so that a new chip tray on one end of the transfer tray 520 can enter and the empty chip tray on the other end of the transfer tray 520 can exit. After the rotation, the transfer tray 520 falls into the opening of the chip tray bracket 700, and the new chip tray is erected on the chip tray bracket 700.

Figure 9:
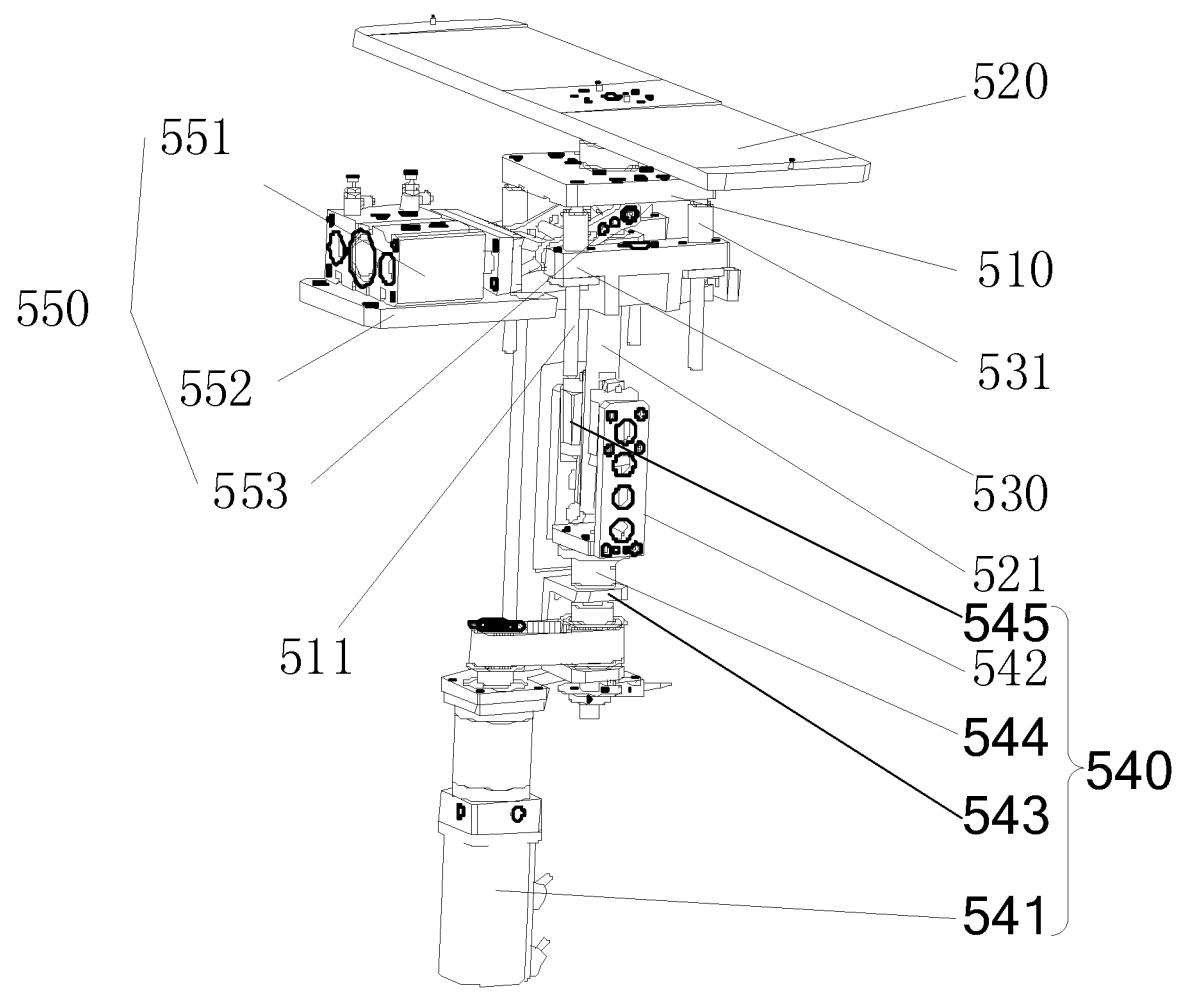
FIG. 9 is a schematic diagram of a transfer tray platform according to an embodiment of the present disclosure.

In an embodiment of the present disclosure, as illustrated in FIG. 9, in order to realize the lifting and rotation of the transfer tray 520, the chip detection system of the present disclosure includes a lifting platform 510, a transfer tray 520, a fixing platform 530, a rotation driving device 540 and a lifting driving device 550.

In an embodiment of the present disclosure, the transfer tray 520, the lifting platform 510, and the fixing platform 530 are disposed in sequence from top to bottom. A middle part of the fixing platform 530 is provided with a through cavity that penetrates through the fixing platform 530 in the longitudinal direction. The fixing platform 530 may be a rectangular frame, or have a hollowed middle part with a periphery provided with a stabilizing hole. An axial direction of the stabilizing hole is longitudinal. Since the lifting platform 510 is to be longitudinally displaced relative to the fixing platform 530, the lifting platform 510 is provided with a stabilizing rod 511 corresponding to the stabilizing hole. The stabilizing rod 511 is inserted into the stabilizing hole and can slide longitudinally therein. In order to ensure the smooth longitudinal sliding of the lifting platform 510 and reduce the pressure of the lifting platform 510 on the lifting driving device 550, a limiting strut 531 is disposed between the fixing platform 530 and the lifting platform 510. In this embodiment, the limiting strut 531 is fixedly connected to the fixing platform 530. Preferably, to reduce the cost, the limiting strut 531 is tubular with a lumen longitudinally coincided with the stabilizing hole, and the stabilizing rod 511 is inserted into the lumen of the limiting strut 531 and the stabilizing hole to slide therein.

In an embodiment of the present disclosure, in T order to facilitate the mounting of a tray rotating shaft 521, in addition to the through cavity disposed at the middle part of the fixing platform 530, the lifting platform 510 is provided with a rotating shaft hole corresponding to the through cavity of the fixing platform 530. A middle part of the tray rotating shaft 521 is disposed in the through cavity of the fixing platform 530 without contacting the side wall of the through cavity. The tray rotating shaft 521 is inserted into the rotating shaft hole and rotatably connected to the rotating shaft hole through a bearing, by which the tray rotating shaft 521 is supported. An upper end of the tray rotating shaft 521 is fixedly connected to the transfer tray 520 to drive the transfer tray 520 to rotate.

In an embodiment of the present disclosure, the lifting driving device 550 is a linear motion driving device, which is connected to the lifting platform 510 to drive the lifting platform 510 to lift.

In an embodiment of the present disclosure, the lifting driving device 550 may be an electrical push rod which is fixedly connected to the fixing platform 530. An upper end of the electrical push rod is fixedly connected to the lifting platform 510. The electrical push rod can control the lifting of the lifting platform 510.

Preferably, the lifting driving device 550 includes a slide table 552, a gas cylinder 551 and an ejector rod 553.

In an embodiment of the present disclosure, the slide table 552, used as a mounting platform, is fixedly connected to the fixing platform 530. The gas cylinder 551 is disposed on the slide table 552. An upper part of the ejector rod 553 is hinged with a lower part of the lifting platform 510, and a lower part of the ejector rod 553 is hinged with a push rod of the gas cylinder 551. In order to limit the motion track of the ejector rod 553, an inner side of the fixing platform 530 is provided with a horizontal displacement slot, and a lower end of the ejector rod 553 is provided with a protrusion, which is slidably disposed in the displacement slot. Under the action of the push rod of the gas cylinder 551, the lower part of the ejector rod 553 slides horizontally in the displacement slot. When the lower end of the ejector rod 553 is close to the gas cylinder 551, the ejector rod 553 is inclined. When the push rod pushes the lower end of the ejector rod 553 to move away from the gas cylinder 551, the ejector rod 553 changes from an inclined state to a vertical state and jacks up the lifting platform 510.

In an embodiment of the present disclosure, the rotation driving device 540 is a circular motion driving device, which is connected to the tray rotating shaft 521 to drive the transfer tray 520 to rotate.

In an embodiment of the present disclosure, the driving device 540 includes a motor and a linkage pipe. The linkage pipe has a lumen, and the shape of the cross section of the lumen is non-circular. The motor is fixedly connected to the fixing platform 530. A lower end of the tray rotating shaft 521 has the same cross-sectional shape as the lumen of the linkage pipe, and is inserted thereinto. A rotating shaft of the motor is connected to the linkage pipe directly or through a reducer. A length of the tray rotating shaft 521 inserted into the linkage pipe is greater than a maximum rising height of the lifting platform 510.

Alternatively, as illustrated in FIG. 9, the rotation driving device 540 includes a motor 541, a U-shaped linkage frame 542, and a rotating shaft fixing seat 543. A middle part of a closed-end of the U-shaped linkage frame 542 is provided with a linkage shaft 544 which is fixedly connected to the U-shaped linkage frame 542. The linkage shaft 544 is connected to the rotating shaft fixing seat 543 through a bearing. The rotating shaft fixing seat 543 keeps the linkage shaft 544 and the U-shaped linkage frame 542 to be stable. The rotating shaft fixing seat 543 is connected to the fixing platform 530 through a bracket such as a rectangular plate, a length direction of which is longitudinal. The rotating shaft fixing seat 543 is disposed at a lower part of the rectangular plate and is rotatably connected to the tray rotating shaft 521. Alternatively, the rotating shaft fixing seat 543 is mounted on any other fixed structure, such as a box of the detection device or the cabinet 600. A lower part of the tray rotating shaft 521 is inserted into a middle part of an open end of the U-shaped linkage frame 542, and two sides of the tray rotating shaft 521 are slidably connected to two ends of the U-shaped linkage frame 542 respectively through a linear bearing 545. In this case, the tray rotating shaft 521 and the U-shaped linkage frame 542 can slide relative to each other in the longitudinal direction, and the U-shaped linkage frame 542 can also drive the tray rotating shaft 521 to rotate. The motor 541 and the linkage shaft 544 are linked by belts or gears. Alternatively, the rotating shaft of the motor 541 is directly connected to the linkage shaft 544 to drive the same to rotate. The linkage shaft 544 drives the tray rotating shaft 521 to rotate through the U-shaped linkage frame 542. This structure can greatly improve the stability of the tray rotating shaft 521. The motor 541 may be fixedly connected to the fixing platform 530 through a bracket, or fixed on any other device.

In an embodiment of the present disclosure, in order to keep the stability of the chip tray during the rotation of the transfer tray 520, positioning protrusions are provided at two ends of the transfer tray 520. Correspondingly, positioning slots may be provided at corresponding positions of the chip tray to fit with the positioning protrusions. The positioning protrusions can position and stabilize the chip tray, so as to prevent the situation that the chip tray cannot reach the designated position due to the relative movement between the chip tray and the transfer tray 520 during rotation of the transfer tray 520.

In an embodiment of the present disclosure, the chip detection device can be applied to a chip detection apparatus, which is provided with a frame-shaped chip tray bracket 700 having one end inside the detection apparatus, and the other end outside the detection apparatus. The lifting platform 510 is located in the chip tray bracket 700. In the working process of the present disclosure, the transfer tray 520 and the chip tray bracket have the same position, i.e., one end is located inside the chip detection apparatus and the other end is located outside the chip detection apparatus. By rotating the transfer tray 520, positions of an empty chip tray located inside the chip detection apparatus and a new chip tray located outside the chip detection apparatus are exchanged, so the feeding and discharging of the chip tray can be completed at the same time, thereby realizing the entry and removal of the chip tray.

Specifically, the lifting driving device 550 lifts the lifting platform 510, the lifting platform 510 lifts the transfer tray 520, and the transfer tray 520 holds up the detected chip tray inside the detection apparatus that has been detected and the undetected chip tray outside the detection apparatus that has not been detected to separate the detected chip tray from the chip tray bracket 700;

then the rotation driving device 540 drives the transfer tray 520 to rotate by 180 degrees, so that positions of the chip trays inside and outside the detection apparatus are exchanged;

hereafter, the lifting driving device 550 drives the lifting platform 510 to descend, the transfer tray 520 descends along with the lifting platform 510, and the undetected chip tray on the transfer tray 520 is received by one end of the chip tray bracket 700, which is inside the detection apparatus, so as to complete the replacement of the chip tray.

Compared with the traditional push-in and push-out mode, the present disclosure can significantly improve efficiency while optimizing the workflow. A worker only needs to replace the empty chip tray outside the chip detection apparatus with a new chip tray without waiting at the apparatus. Therefore, the present disclosure has the beneficial effect of improving the working efficiency, and one worker can complete the replacement of the chip tray for a plurality of apparatuses.

In this embodiment, the turntable 200 is a regular hexagonal cylinder, each side surface of which is provided with a chip test tray 220. A lower part of the side surface of the turntable 200 is provided with a main gas hole 211. There are six main gas holes 211 in the turntable 200. The vacuum ring 400 is provided with three negative-pressure gas holes 401 and one positive-pressure gas hole 402. When the chip test tray 220 rotates along with the turntable 200 to a horizontal position of the upper part of the turntable 200, three main gas holes 211 at the upper part of the turntable 200 directly face the three negative-pressure gas holes 401, and the positive-pressure gas hole 402 at the lower part of the vacuum ring 400 faces the main gas hole 211 at the lowermost part of the turntable 200. In this embodiment, the electrical apparatus is electrically connected to a controller, which adopts a PLC module. The gas valve of the gas source, which is required by the manipulator and the chip detection device, is an electromagnetic gas valve. The electromagnetic gas valve is connected to the controller and the external gas source, and the controller controls the on-off of the gas source through the electromagnetic gas valve.

It is a third aspect of the present disclosure to provide a control method for the chip detection system according to the second aspect of the present disclosure, the control method is as follows.

In an embodiment of the present disclosure, an axis direction of the turntable 200 is horizontal, and the operating arm is parallel to the axis direction of the turntable 200. Viewing the vacuum ring 400 from the turntable 200 and taking a clockwise rotation as an example, the main gas hole 211 will be switched to be communicated with another negative-pressure gas hole 401 after rotating for an angle. Therefore, the negative-pressure gas hole 401 corresponding to the detected chip placement slot 222 can cut off the gas supply independently, so as to facilitate the unloading of the chip. When the main gas hole 211 rotates to be communicated with the positive-pressure gas hole 402, the gas is blown out of the main gas hole 211, so that the chip stuck in the chip placement slot 222 is blown off. The rotation of the turntable 200 realizes the switching of the gas source. After the chip detection system is started, a negative-pressure gas source and a positive-pressure gas source are connected to the vacuum ring 400;

Step A: controlling the loading manipulator 910 to move above the chip tray, and adjusting the vacuum sucker of the loading manipulator 910 to face downward, so that the vacuum sucker of the loading manipulator 910 is corresponding to a column of chips on the chip tray;

the loading manipulator 910 is connected to the negative-pressure gas source and moves downward, until the vacuum sucker of the loading manipulator 910 adsorbs the chip on the chip tray;

or, the loading manipulator 910 moves downward until the vacuum sucker of the loading manipulator 910 is close to the chip, and the negative-pressure gas source is turned on to adsorb the chip onto the vacuum sucker of the loading manipulator 910. In this case, the interference to other chips can be reduced, and other chips can be prevented from being disturbed, so as to avoid any missing of the chips;

after the chip is adsorbed, controlling the loading manipulator 910 to move upward, and rotating the operating arm 902 so that the vacuum sucker of the loading manipulator 910 is opposite to the chip placement slot 222 of the chip test tray 220 on the turntable 200;

controlling the loading manipulator 910 to move to the turntable 200 until the chip is placed in the chip placement slot 222, and at this time, turning off the negative-pressure gas source of the loading manipulator 910; since the turntable 200 itself has a negative pressure, the adsorption through hole 221 adsorbs the chip in the chip placement slot 222;

repeating Step A, until all chip placement slots 222 on a left side of the turntable 200 is filled with the chips;

Step B: when a side surface of the turntable 200 rotates to a horizontal plane at the upper part of the turntable 200, controlling the first driving device 120 to drive the probe holder 110 to descend until a probe on the probe holder 110 abuts against the chip in the chip placement slot 222;

starting a test program to test the chip;

after the chip is tested, recording a test result, and controlling the first driving device 120 to drive the probe holder 110 to rise; sending the recorded test result to the controller;

Step C: turning on the negative-pressure gas source of the unloading manipulator 920, and adjusting the vacuum sucker of the unloading manipulator 920 to be opposite to the chip placement slot 222 on a right side of the turntable 200;

controlling the unloading manipulator 920 to move to the turntable 200 until the vacuum sucker of the unloading manipulator 920 adsorbs the chip on the turntable 200 that has been detected, a vacuum degree of the vacuum sucker of the unloading manipulator 920 being greater than that of the turntable 200;

reading the detection result, and controlling the unloading manipulator 920 to move above the corresponding distribution tray 800 according to the detection result;

controlling the unloading manipulator 920 to move downward, and when the vacuum sucker of the unloading manipulator 920 is located at an upper part of the distribution tray 800, turning off the negative-pressure gas source of the unloading manipulator 920, so that the chip falls into the distribution tray 800;

or, controlling the unloading manipulator 920 to move to a position where the distance between the vacuum sucker and the distribution tray is proper, the distance being a vertical distance therebetween, and then controlling the unloading manipulator 920 to move from a near distribution tray to a distant distribution tray; when the unloading manipulator 920 moves to a position of the corresponding distribution tray, switching the gas source according to the read detection result so that the chip falls into the distribution tray.

Step D: when a side of the turntable 200, where there is a chip remaining in the chip placement slot 222 that is stuck or not be adsorbed, rotates to the horizontal plane at the lower part of the turntable 200, discharging the remained chip into the flash box 300 by the positive-pressure gas source introduced into the main gas hole 211 at the lower part of the turntable 200;

Step E: after all of the chips on the chip tray are detected, a lifting driving device 550 lifts a lifting platform 510, the lifting platform 510 lifts a transfer tray 520, and the transfer tray 520 holds up the detected chip tray inside the cabinet 600 and the undetected chip tray outside the cabinet 600 to separate the detected chip tray from the chip tray bracket 700;

the rotating device 540 drives the transfer tray 520 to rotate by 180 degrees, so that the chip trays inside and outside the cabinet 600 exchange positions;

the lifting driving device 550 drives the lifting platform 510 to descend, and the transfer tray 520 descend along with the lifting platform 510 to place the undetected chip tray onto the chip tray bracket 700.

During the operation, the loading manipulator 910, the unloading manipulator 920 and the turntable 200 operate simultaneously, which greatly improves the chip detection efficiency.

In an embodiment of the present disclosure, in order to enhance the protection of the chip, the upper part of the distribution tray 800 is provided with an inclined slide plate, In this case, Step C further comprises:

after adsorbing the chip, the vacuum sucker of the unloading manipulator 92 is rotated to be opposite to the inclined slide plate inside the distribution tray 800;

when the vacuum sucker of the unloading manipulator 920 is located at the upper part of the distribution tray 800, the negative-pressure gas source of the unloading manipulator 920 is turned off and the positive-pressure gas source is turned on, and the chip falls on the inclined slide plate and then slides into the distribution tray 800.

In an embodiment of the present disclosure, the turntable 200 is a regular hexagonal cylinder and provided with six main gas holes 211. The vacuum ring 400 is provided with three negative-pressure gas holes 401 and one positive-pressure gas hole 402. When one of the chip test trays 220 rotates along with the turntable 200 to a horizontal plane of the upper part of the turntable 200, the three negative-pressure gas holes 401 are corresponding to and communicated with three main gas holes 211 at the upper part of the turntable 200, and the positive-pressure gas holes 402 is corresponding to and communicated with a main gas hole 211 at the lower part of the turntable 200; correspondingly, the communication slot 213 is disposed at an orifice of the main gas hole 211, and is cambered with a length less than or equal to a distance between two main gas holes 211; the positive-pressure gas hole 402 is used to connect to the positive-pressure gas source, and communicates with the positive-pressure gas source through the electromagnetic gas valve to realize the opening and closing control of the gas source.

In an embodiment of the present disclosure, the main gas hole 211 communicates with the gas source through the communication slot 213 during the rotation of the main gas hole 211, and communications from the main gas hole 211 to the negative-pressure gas hole 401 and the positive-pressure gas hole 402 of the vacuum ring are switched during the rotation of the main gas hole 211. In this case, Step C further comprises:

when the unloading manipulator 920 is controlled to move to the turntable 200 until the vacuum sucker of the unloading manipulator 920 moves to the vicinity of the chip that has been detected, the gas source of the negative-pressure gas hole 401 corresponding to the chip is turned off, and the negative-pressure gas source of the unloading manipulator 920 is turned on to adsorb the chip;

after the vacuum sucker of the unloading manipulator 920 adsorbs the chip, the previously turned off negative-pressure gas source of the negative-pressure gas hole 401 is turned on; after the vacuum sucker of the unloading manipulator 920 moves to the corresponding distribution tray 800, the negative-pressure gas source of the unloading manipulator 920 is turned off, and the chip falls into the distribution tray 800.

Those described above are just preferred embodiments of the present disclosure, and are not intended to limit the scope of the present disclosure. Through the above descriptions, persons skilled in the art can make various changes and modifications without deviating from the technical idea of the present disclosure. The technical scope of the present disclosure is not limited to the content of the specification. Any equivalent change or modification to the shape, structure, feature and spirit according to the claimed scope of the present disclosure should be included in the scope of the claims of the present disclosure.

The invention claimed is:

1. A chip detection device, comprising: support plates, a detection platform erected between two of the support plates, a first driving device disposed on the support plate and capable of a linear motion, and a probe holder disposed above the detection platform and connected to the first driving device;

the detection platform comprises:
a turntable of a cylindrical structure, with two ends rotatably connected to the support plates;
a vacuum ring, having one end provided with an end face fixedly connected to the support plate, and the other end provided with an end face hermetically and rotatably connected to an end face of the turntable;
a second driving device disposed on the support plate and capable of driving the turntable to rotate;
at least three groups of chip test trays uniformly distributed on a cylindrical surface of the turntable, each group of chip test trays being arranged in a length direction of the cylindrical surface of the turntable;
wherein the chip test tray is provided with a chip placement slot, bottoms of the chip placement slots on all of the chip test trays are electrically communicated with each other, and a center of the bottom of the chip placement slot is provided with an adsorption through hole;

the turntable is provided with
a main gas hole disposed in an axial direction of the turntable and corresponding to the chip test tray in a radial direction of the turntable, an end of the main gas hole close to the vacuum ring being opened and the other end thereof being closed; and
a branch gas hole which communicates the main gas hole and the adsorption through hole of the chip test tray;

the vacuum ring is provided with a negative-pressure gas hole which has one orifice located on an end face of the vacuum ring abutting against the turntable and on a same circumference as the main gas hole, and the other orifice connected to a negative-pressure gas source;

the orifice of the negative-pressure gas hole or an orifice of the main gas hole is provided with a communication slot which communicates the negative-pressure gas hole and the main gas hole when they are staggered.

2. The chip detection device according to claim 1, wherein there is one negative-pressure gas hole, and correspondingly, the communication slot is annular.

3. The chip detection device according to claim 1, wherein there is one negative-pressure gas hole, and the vacuum ring is further provided with a positive-pressure gas hole longitudinally symmetrical with respect to the negative-pressure gas hole, the positive-pressure gas hole being connected to a positive-pressure gas source; correspondingly, the communication slot is disposed on the vacuum ring, a radian of the communication slot corresponding to the negative-pressure gas hole is greater than 180 degrees, and a radian of the communication slot corresponding to the positive-pressure gas hole is less than D, D=360/n, where n is the number of the main gas holes.

4. The chip detection device according to claim 1, wherein there are three negative-pressure gas holes; when one of the chip test trays is located on a horizontal plane of an upper part of the turntable, the three negative-pressure gas holes are corresponding to and communicated with three main gas holes at the upper part of the turntable, correspondingly, the communication slot is disposed at the orifice of the main gas hole and is cambered; or the main gas hole and the communication slot have a same cross-sectional shape and are both cambered, and the main gas hole and the communication slot form a through hole.

5. The chip detection device according to claim 4, wherein the vacuum ring is further provided with one positive-pressure gas hole; when one of the chip test trays is located on the horizontal plane of the upper part of the turntable, the three negative-pressure gas holes are corresponding to and communicated with three main gas holes at the upper part of the turntable, and the positive-pressure gas hole is corresponding to and communicated with the main gas hole at a lower part of the turntable;

the positive-pressure gas hole is connected to a positive-pressure gas source.

6. The chip detection device according to claim 1, further comprising:
a flash box disposed below the detection platform and detachably connected to the support plate.

7. The chip detection device according to claim 1, wherein the turntable is a cylinder, a length direction of the chip test trays is the same as the axial direction of the turntable, and the chip test trays are sequentially arranged in the length direction of the cylindrical surface of the turntable; or
the turntable is a regular polyhedral cylinder with at least three side surfaces; the length direction of the chip test trays is the same as the axial direction of the turntable, and the chip test trays are sequentially arranged in the length direction of the cylindrical surface of the turntable and are arranged in a plurality of rows in the length direction.

8. The chip detection device according to claim 7, wherein the turntable is a regular hexagonal cylinder or a regular octahedral cylinder.

9. The chip detection device according to claim 7, wherein the chip test tray is provided with a plurality of rows of chip placement slots in the length direction of the chip test tray.

10. The chip detection device according to claim 7, wherein
the chip test tray comprises a conductive layer, and an insulating layer that is in contact with the turntable.

11. The chip detection device according to claim 7, wherein
a probe of the probe holder is disposed inside a cavity communicated with a positive-pressure inert gas source, and the cavity is opened on a side where a probe head of the probe is located.

12. The chip detection device according to claim 11, wherein
the cavity is surrounded by the probe holder and an enclosure disposed on a periphery of the probe holder; the enclosure or the probe holder is provided with a main protective gas hole and a gas dispersion hole; a length direction of the main protective gas hole is parallel to a length direction in which the probes are arranged; the main protective gas hole and the cavity are communicated via the gas dispersion hole, and the main protective gas hole is communicated with the positive-pressure inert gas source.

13. The chip detection device according to claim 12, wherein
the number of the gas dispersion holes is the same as that of the probes, and each of the gas dispersion holes on a side of the probes is inclined to a probe head of the corresponding probe;
a distance between a lower end of the enclosure and a bottom surface of the probe holder is slightly smaller than that between a bottom end of the probe and the bottom surface of the probe holder; or
an upper part of the enclosure is longitudinally and slidably connected to the probe holder, and when the first driving device drives the probe holder to descend toward the chip test tray, the enclosure abuts against the chip test tray to seal the cavity and increase the concentration of inert gas in the cavity, and then the probe holder continues to descend to be in contact with a chip for detection.

14. A chip detection system, comprising a cabinet, which is internally provided with a controller, a loading manipulator, an unloading manipulator, a chip tray bracket disposed on a side of the loading manipulator, and a distribution tray disposed on a side of the unloading manipulator;
a chip detection device is disposed between the loading manipulator and the unloading manipulator;
the chip detection device comprises: support plates fixedly connected to a cabinet, a detection platform erected between two of the support plates, a probe holder disposed above the detection platform, a first driving device disposed on the support plate and capable of driving the probe holder to move longitudinally, and a second driving device disposed on the support plate and capable of driving the detection platform to rotate;
the controller is electrically connected to the loading manipulator, the unloading manipulator and the chip detection device, and controls the loading manipulator to place a chip from the chip tray bracket onto the rotating detection platform; when the chip rotates with the detection platform to an upper position facing the probe holder, the probe holder descends to detect the chip; the controller controls the unloading manipulator to remove the chip that has been detected on the detection platform and place the chip in the corresponding distribution tray, wherein the detection platform comprises:
a turntable of a cylindrical structure, with two ends rotatably connected to the support plate;
a vacuum ring, having one end provided with an end face fixedly connected to the support plate, and the other end provided with an end face hermetically and rotatably connected to an end face of the turntable;
wherein the turntable is provided with a main gas hole in an axial direction thereof, an end of the main gas hole close to the vacuum ring being opened and the other end thereof being closed; the turntable is provided with at least three main gas holes, which are uniformly distributed in a circumferential direction of the turntable; uniformly distributed branch gas holes are provided in a length direction of the main gas holes, and orifices of the branch gas holes are opened at a side surface of the turntable;
the side surface of the turntable is provided with chip test trays corresponding to the main gas holes; the chip test tray is provided with a chip placement slot, and bottoms of the chip placement slots on all of the chip test trays are electrically communicated with each other; a center of the bottom of the chip placement slot is provided with an adsorption through hole which is corresponding to and hermetically communicated with the branch gas hole;
the vacuum ring is provided with a negative-pressure gas hole which has one orifice located on an end face of the vacuum ring abutting against the turntable and on a same circumference as the main gas hole, and the other orifice connected to a negative-pressure gas source through a gas inlet valve;
the orifice of the negative-pressure gas hole or an orifice of the main gas hole is provided with a communication slot which communicates the negative-pressure gas hole and the main gas hole when they are staggered.

15. The chip detection system according to claim 14, wherein
there is one negative-pressure gas hole, and correspondingly, the communication slot is annular.

16. The chip detection system according to claim 14, wherein
there are three negative-pressure gas holes, and the vacuum ring is further provided with a positive-pressure gas hole;
when one of the chip test trays is located on a horizontal plane of an upper part of the turntable, the three negative-pressure gas holes correspond to and communicate with three main gas holes at the upper part of the turntable, and the positive-pressure gas hole corresponds to and communicates with the main gas hole at the lower part of the turntable;
correspondingly, the communication slot is disposed at the orifice of the main gas hole and is cambered, and a length of the communication slot is less than or equal to a distance between two adjacent main gas holes;
the positive-pressure gas hole is connected to a positive-pressure gas source.

17. The chip detection system according to claim 14, wherein
the turntable is a cylinder, or a regular polyhedral cylinder with at least three side surfaces;
a length direction of the chip test trays is the same as the axial direction of the turntable, and the chip test trays are sequentially arranged in a length direction of a cylindrical surface of the turntable.

18. The chip detection system according to claim 14, wherein
each of the main gas holes corresponds to two groups of chip test trays, and correspondingly, the main gas hole is provided with two groups of branch gas holes which are respectively communicated with the adsorption through holes of the two groups of chip test trays.

19. The chip detection system according to claim 14, wherein
the distribution trays are boxes with open upper parts and disposed on a right side of the chip detection device in parallel, and upper parts of the distribution trays are provided with inclined slide plates.

20. The chip detection system according to claim 19, further comprising:
a flash box disposed below the detection platform, and detachably connected to the support plate or the cabinet.

21. The chip detection system according to claim 19, wherein
a probe of the probe holder is disposed inside a cavity communicated with a positive-pressure inert gas source, and the cavity is opened on a side where a probe head of the probe is located;
the cavity is surrounded by the probe holder and an enclosure disposed on a periphery of the probe holder; the enclosure or the probe holder is provided with a main protective gas hole and a gas dispersion hole; a length direction of the main protective gas hole is parallel to a length direction in which the probes are arranged; the main protective gas hole communicates with the cavity via the gas dispersion hole, and the main protective gas hole is communicated with the positive-pressure inert gas source.

22. The chip detection system according to claim 21, wherein
a length direction of the gas dispersion hole is pointed to an end of the probe.

23. The chip detection system according to claim 20, wherein
the chip detection system further comprises a feeding device comprising a lifting platform, a transfer tray, a fixing platform, a rotation driving device, and a lifting driving device, a middle part of the chip tray bracket being provided with a through opening in which the transfer tray is disposed;
a middle part of the fixing platform is provided with a cavity that penetrates through the fixing platform in the longitudinal direction; stabilizing holes are disposed around the cavity; a lower part of the lifting platform is provided with stabilizing rods corresponding to the stabilizing holes and slidably inserted therein; the lifting platform is provided with a rotating shaft hole corresponding to the cavity;
a lower part of the transfer tray is provided with a tray rotating shaft fixedly connected thereto; a middle part of the tray rotating shaft is inserted into the cavity of the fixing platform and the rotating shaft hole of the lifting platform, and is rotatably connected to the rotating shaft hole;
the lifting driving device is a linear motion driving device, and is connected to the lifting platform to drive the lifting platform to lift;
the rotatable driving device is a circular motion driving device, and is connected to the lower end of the tray rotating shaft to drive the transfer tray to rotate;
the lifting driving device and the rotation driving device are electrically connected to the controller.

24. The chip detection system according to claim 23, wherein
an upper part of the fixing platform is provided with a tubular limiting strut, a lumen of which longitudinally coincided with the stabilizing hole.

25. The chip detection system according to claim 23, wherein
the lifting driving device comprises a slide table, a gas cylinder, and an ejector rod;
the slide table is fixedly connected to the fixing platform, the cylinder is disposed on the slide table, and a horizontal displacement slot is disposed on an inner side of the fixing platform;
an upper part of the ejector rod is hinged with the lower part of the lifting platform, a lower part of the ejector rod is hinged with a push rod of the gas cylinder, and a lower end of the ejector rod is provided with a protrusion and is slidably disposed in the displacement slot.

26. The chip detection system according to claim 23, wherein
the rotation driving device comprises a motor, a U-shaped linkage frame and a rotating shaft fixing seat;
a middle part of a closed-end of the U-shaped linkage frame is provided with a linkage shaft which is connected to the rotating shaft fixing seat;
a lower part of the tray rotating shaft is inserted in a middle part of an open end of the U-shaped linkage frame, and two sides of the tray rotating shaft are slidably connected to two branches of the U-shaped linkage frame through a linear bearing
the motor drives the tray rotating shaft to rotate via the linkage shaft and the U-shaped linkage frame.

27. The chip detection system according to claim 14, wherein
the loading manipulator comprises a horizontal moving module, a longitudinal moving module disposed on the horizontal moving module, and a rotating module disposed at a lower end of the longitudinal moving module; the rotating module is provided with an adsorption module; the longitudinal moving module is provided with a gas valve which has one end communicated with the adsorption module and the other end connected to a gas source.

28. The chip detection system according to claim 14, wherein the unloading manipulator comprises a horizontal moving module, a longitudinal moving module disposed on the horizontal moving module, and a rotating module disposed at a lower end of the longitudinal moving module; the rotating module is provided with an adsorption module; the longitudinal moving module is provided with a gas valve which has one end communicated with the adsorption module, and the other end connected to a gas source.

29. A control method of the chip detection system according to claim 14, comprising the steps of:

after the chip detection system is started, turning on the negative-pressure gas source of the negative-pressure gas hole and the positive-pressure gas source of the positive-pressure gas hole on the vacuum ring; the main gas hole on the rotating turntable obtains a gas supply through the vacuum ring;

Step A: controlling the loading manipulator to move above the chip tray, and adjusting the vacuum sucker of the loading manipulator to face downward, so that the vacuum sucker of the loading manipulator corresponds to a column of chips on the chip tray;

turning on the negative-pressure gas source of the loading manipulator and moving the loading manipulator downward until the vacuum sucker of the loading manipulator adsorbs the chip on the chip tray; or, moving the loading manipulator downward until the vacuum sucker of the loading manipulator is close to the chip, and turning on the negative-pressure gas source to adsorb the chip onto the vacuum sucker of the loading manipulator;

controlling the loading manipulator to move upward, and rotating an operating arm until the vacuum sucker of the loading manipulator is opposite to the chip placement slot of the chip test tray on the turntable;

controlling the loading manipulator to move to the turntable until the chip is placed in the chip placement slot, and turning off the negative-pressure gas source of the loading manipulator;

repeating Step A, until all chip placement slots on a left side of the turntable are filled with the chips;

Step B: when a side surface of the turntable rotates to a horizontal plane at the upper part of the turntable, controlling the first driving device to drive the probe holder to descend until a probe on the probe holder abuts against the chip in the chip placement slot;

starting a test program to test the chip;

after the chip is tested, recording a test result, and controlling the first driving device to drive the probe holder to rise;

Step C: turning on the negative-pressure gas source of the unloading manipulator, and adjusting the vacuum sucker of the unloading manipulator to be opposite to the chip placement slot on a right side of the turntable;

controlling the unloading manipulator to move to the turntable until the vacuum sucker of the unloading manipulator adsorbs the chip that has been detected on the turntable, a vacuum degree of the vacuum sucker of the unloading manipulator being greater than that of the turntable;

reading the detection result, and controlling the unloading manipulator to move above the corresponding distribution tray according to the detection result;

controlling the unloading manipulator to move downward, and when the vacuum sucker of the unloading manipulator is located at an upper part of the distribution tray, turning off the negative-pressure gas source of the unloading manipulator, so that the chip falls into the distribution tray;

Step D: when a side of the turntable, where there is a chip remaining in the chip placement slot that is stuck or not be adsorbed, rotates to the horizontal plane at the lower part of the turntable, discharging the remained chip into a flash box by the positive-pressure gas source introduced into the main gas hole at the lower part of the turntable;

Step E: after all of the chips on the chip tray are detected, a lifting driving device lifts a lifting platform, the lifting platform lifts the transfer tray, and the transfer tray holds up the detected chip tray inside the cabinet and the undetected chip tray outside the cabinet to separate the detected chip tray from the chip tray bracket;

the rotating device drives the transfer tray to rotate by 180 degrees, so that the chip trays inside and outside the cabinet exchange positions; and the lifting driving device drives the lifting platform to descend, and the transfer tray descends along with the lifting platform to place the undetected chip tray onto the chip tray bracket.

30. The control method of the chip detection system according to claim 29, wherein the upper part of the distribution tray is provided with an inclined slide plate, and Step C further comprises:

after adsorbing the chip, the vacuum sucker of the unloading manipulator is rotated to be opposite to the inclined slide plate inside the distribution tray; and when the vacuum sucker of the unloading manipulator is located above the distribution tray, the negative-pressure gas source of the unloading manipulator is turned off and the positive-pressure gas source is turned on, and the chip falls on the inclined slide plate and then slides into the distribution tray.

31. The control method of the chip detection system according to claim 29, wherein the turntable is a regular hexagonal cylinder provided with six main gas holes, and the vacuum ring is provided with three negative-pressure gas holes and one positive-pressure gas hole; when one of the chip test trays is located on the horizontal plane at the upper part of the turntable, the three negative-pressure gas holes are corresponding to and communicated with three main gas holes at the upper part of the turntable, and the positive-pressure gas hole is corresponding to and communicated with a main gas hole at the lower part of the turntable; correspondingly, the communication slot is disposed at an orifice of the main gas hole and is cambered, and a length of the communication slot is less than or equal to a distance between two adjacent main gas holes; the positive-pressure gas hole is connected to the positive-pressure gas source;

the main gas hole communicates with the gas source through the communication slot during the rotation of the main gas hole; communications from the main gas hole to the negative-pressure gas hole and the positive-pressure gas hole of the vacuum ring are switched during the rotation of the main gas hole;

Step C further comprises:

when the unloading manipulator is controlled to move to the turntable until the vacuum sucker of the unloading manipulator moves to the vicinity of the chip that has been detected, the gas source of the negative-pressure gas hole corresponding to the chip is turned off, and the negative-pressure gas source of the unloading manipulator is turned on to adsorb the chip; and after the vacuum sucker of the unloading manipulator adsorbs the chip, the previously turned off negative-pressure gas source of the negative-pressure gas hole is turned on; after the vacuum sucker of the unloading manipulator moves to the corresponding distribution tray, the negative-pressure gas source of the unloading manipulator is turned off, and the chip falls into the distribution tray.

* * * * *